United States Patent [19]

Dennis

[11] Patent Number: 5,411,420
[45] Date of Patent: May 2, 1995

[54] SOLDER TERMINAL STRIP

[75] Inventor: Richard K. Dennis, Etters, Pa.

[73] Assignee: Die Tech, Inc., York Haven, Pa.

[21] Appl. No.: 68,062

[22] Filed: May 27, 1993

[51] Int. Cl.⁶ .......................... H01R 4/02; H01R 9/09
[52] U.S. Cl. ........................................ 439/876; 439/83
[58] Field of Search .......................... 439/83, 876, 885

[56] References Cited

U.S. PATENT DOCUMENTS

| 4,203,648 | 5/1980 | Seidler | 339/275 T |
| 4,367,910 | 1/1983 | Seidler | 339/275 B |
| 4,556,276 | 12/1985 | Curtis | 339/258 R |
| 4,718,863 | 1/1988 | Sadigh-Behzadi | 439/496 |
| 4,900,279 | 2/1990 | Dennis | 439/876 |
| 4,932,885 | 6/1990 | Scholz | 439/79 |
| 5,015,206 | 5/1991 | Dennis | 439/876 |
| 5,030,144 | 7/1991 | Seidler | 439/876 |
| 5,162,002 | 11/1992 | Regnier | 439/637 |

Primary Examiner—Eugene F. Desmond
Attorney, Agent, or Firm—Thomas Hooker

[57] ABSTRACT

A solder terminal strip stamp formed from thin metal stock includes a carrier strip, a plurality of solder terminals extending to one side of the carrier strip and reverse bend the contact arms on the ends of the terminals away from the strip. A thin solder layer is integrally bonded to contact arm and is joined to solder reservoirs located on the sides of the arms.

34 Claims, 5 Drawing Sheets

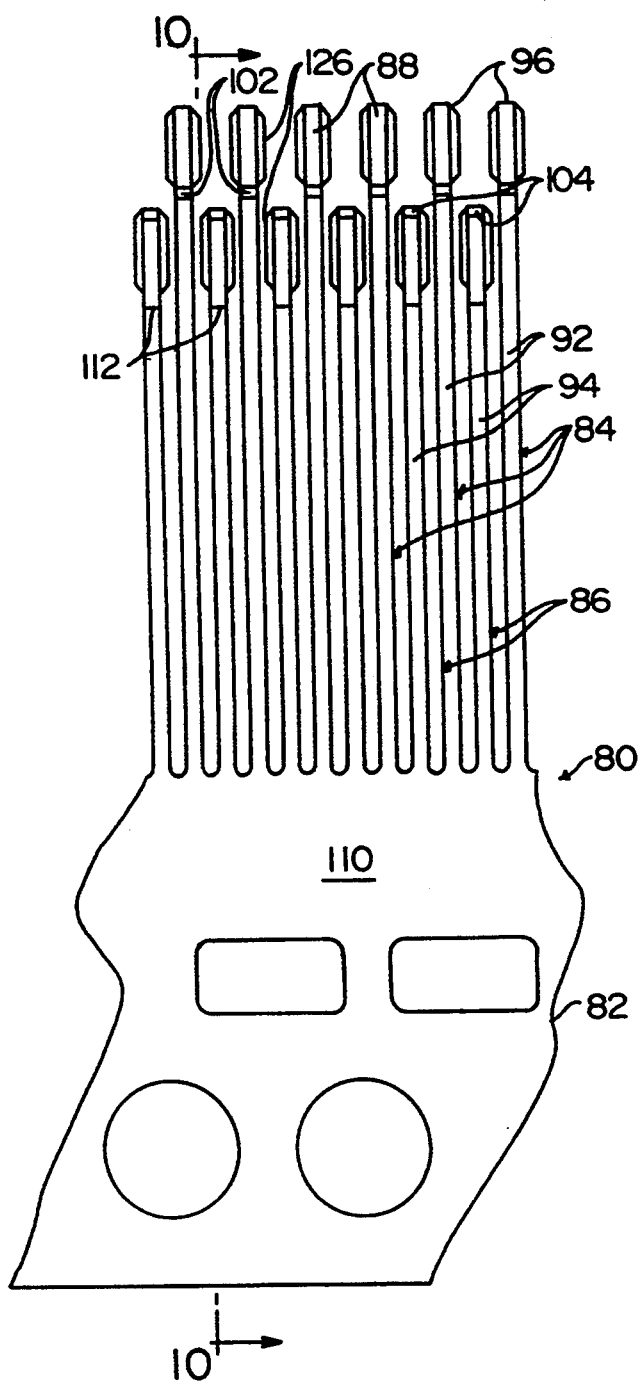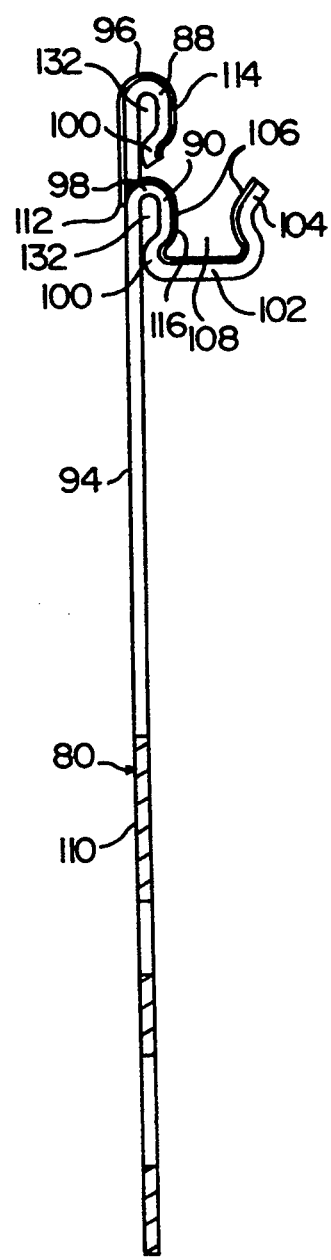
FIG. 9
FIG. 10

SOLDER TERMINAL STRIP

FIELD OF THE INVENTION

The invention relates to stamp-formed terminal strips of the type including a continuous carrier strip with a number of solder terminals extending laterally to one side of the carrier strip. The terminals include long thin contact tails and contact arms on the free ends of the tails for forming soldered connections with contact pads formed on a substrate, typically a ceramic substrate supporting an integrated circuit chip. Solder terminal strips of this type are conventionally positioned adjacent one edge of a substrate with the solder contact arms overlying the pads following which the arms are soldered to the pads.

DESCRIPTION OF THE PRIOR ART

U.S. Pat. No. 5,015,206 discloses a solder terminal strip in which a thick solder overlay is bonded to each contact arm. The solder overlay is flattened to form a thin solder layer overlying the contact arm and two solder reservoirs extruded outwardly of the edges of the arm. The contact arm is positioned on a substrate contact pad with the thin layer engaging the pad and the solder reservoirs located immediately above the pad. The arm is soldered to the pad by heating and melting the solder. The molten solder is drawn into the interface between the arm and the pad by capillary action to form a reliable soldered connection between the terminal and pad.

SUMMARY OF THE INVENTION

The invention is an improved solder terminal strip including a carrier strip and sets of alternating solder terminals extending laterally to one side of the carrier strip for forming soldered electrical connections with two rows of contact pads extending along the edge of a substrate, which may be a very small multi-layer ceramic substrate supporting an integrated circuit chip. Two rows of contact pads are provided along each edge of the substrate in order to accommodate the large number of electrical connections required between circuit elements in the integrated circuit chip supported by the substrate and surrounding supporting circuit, such as a circuit in a computer or other modern electronic device. Each solder terminal includes a long tail, a contact arm and integral masses of solder bonded to the arm as taught by U.S. Pat. No. 5,015,206. The integral solder mass includes a very thin layer overlying the arm, which rests on the substrate pad prior to soldering, and solder reservoirs located to either side of the arm. The terminals are laterally inserted onto the edge of the circuit board to bring the contact arms on alternate terminals into engagement with the contact pads on each of the rows of pads on the substrate. Electrical connections between the terminals and the pads are formed by heating the contact arms and melting and flowing the solder into the joint between the arms and the pads, as described in U.S. Pat. No. 5,015,206.

The solder bodies formed on the solder contact arms of the alternating terminals are formed from a single layer of solder bonded to one side of the metal strip from which the terminal strip is stamped. During stamping, the overlying solder layer is flattened on the solder contact arms to form the thin overlying layer and solder reservoirs facing away from one side of the strip. At least the arm of one set of terminals is bent to 180 degrees to position the thin solder layer on the opposite side of the solder terminal facing away from the side to which the solder layer was bonded. The reverse bent solder contact arm is spaced a distance away from the end of its supporting tail to define a solder recess located immediately behind the arm. During soldering, excess solder is drawn into the recess to prevent flow of the excess solder across the surface of the substrate and possible formation of electrical connections between adjacent contact pads. The two rows of contact pads on the substrate are staggered along the edge of the substrate in order to permit forming electrical connections with alternate solder terminals.

In a first embodiment solder terminal strip, the solder terminals form electrical connections with two rows of pads with the rows being located on opposite sides of the substrate immediately adjacent the edge of the substrate. The pads are staggered along the edge of the substrate. In this way, the width of the pad may be greater than the width of the solder terminal contact arms to accommodate dimensional changes in the substrate due to uneven curing of the ceramic base material. In this embodiment, alternate solder terminals include reverse bend contact arms with integral solder masses for engagement with one row of pads on one side of the substrate and other solder terminals extend across the width of the substrate and include contact arms and attached integral solder bodies to form soldered connections with the second row of contact pads.

A second embodiment solder terminal strip forms electrical connections with two rows of staggered contact pads located on one side of the substrate. In this strip, first alternate solder terminals include reverse bend contact arms with integral solder bodies for engaging the pads of the row located away from the edge. The arms in these terminals are spaced away from the solder tails to provide solder recesses so that excess solder on the terminals does not form bridges between adjacent pads. The tails are located above the pads on the edge of the substrate. The second alternate terminals also include reverse bend contact arms for engaging the pads in the first row of pads. Bridges of these arms extend across the width of the circuit board and include contact arms which engage the reverse side of the substrate. The solder masses on these arms extend along both arms and the bridge joining the arms to establish solder connection with pads on the reverse side of the substrate, if provided.

Other objects and features of the invention will become apparent as the description proceeds, especially when taken in conjunction with the accompanying drawings illustrating the invention, of which there are five sheets and two embodiments.

DESCRIPTION OF THE DRAWINGS

FIG. 9 is a top view of a second embodiment solder terminal similar to FIG. 1;

FIG. 10 is a sectional view taken along line 10—10 of FIG. 9;

DESCRIPTION OF THE PREFERRED EMBODIMENTS

Figure 1:
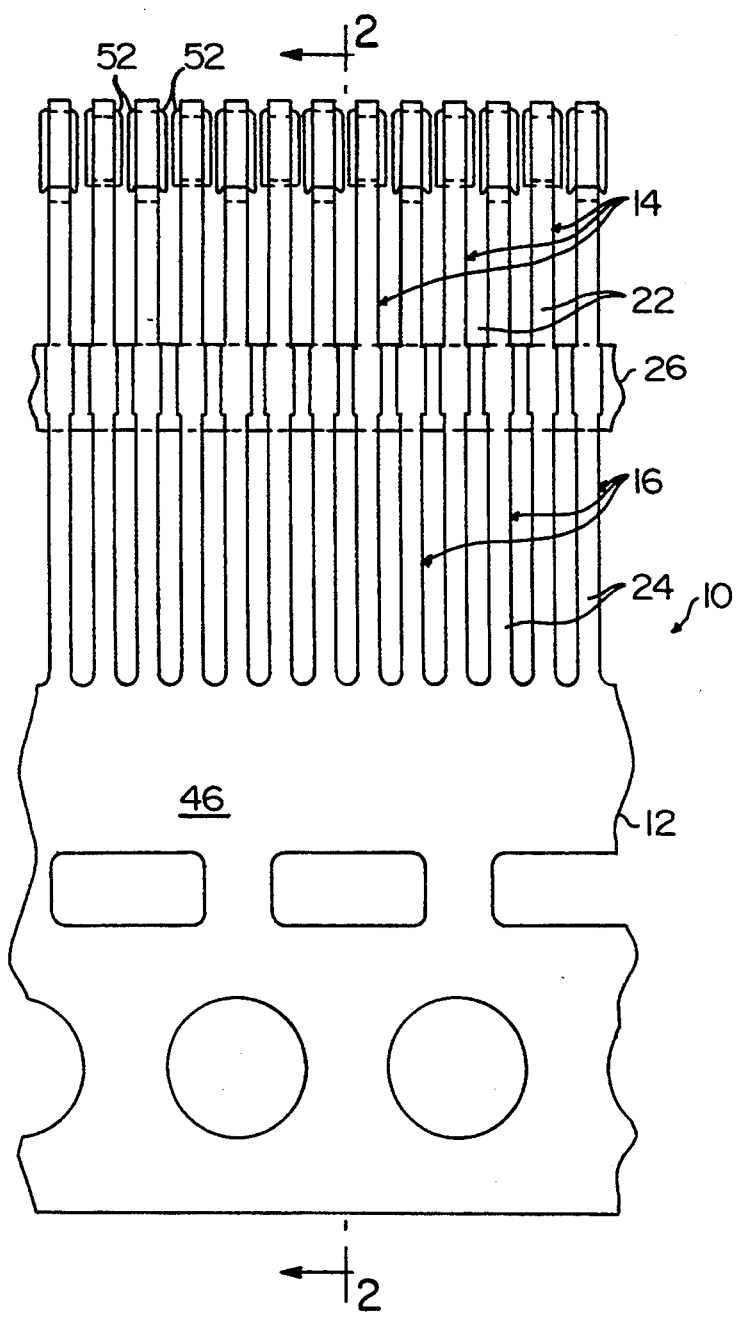
FIG. 1 is a top view of a portion of an elongate strip of solder terminals according to the invention.

FIGS. 1 through 8 illustrate a first preferred embodiment solder terminal strip 10 stamp-formed from a thin strip of metal stock having a solder overlay layer integrally joined to one edge of the stock for forming solder reservoirs on the contact arms of terminals in the strip. Strip 10 includes a continuous carrier strip 12 and sets of alternating solder terminals 14 and 16 extending laterally to one side of the strip 12. The terminals 14 and 16 include solder contact arms 18 and 20 on the ends of the terminals away from the strip and elongate solder tails 22 and 24 extending between the strip and the arms.

Figure 2:
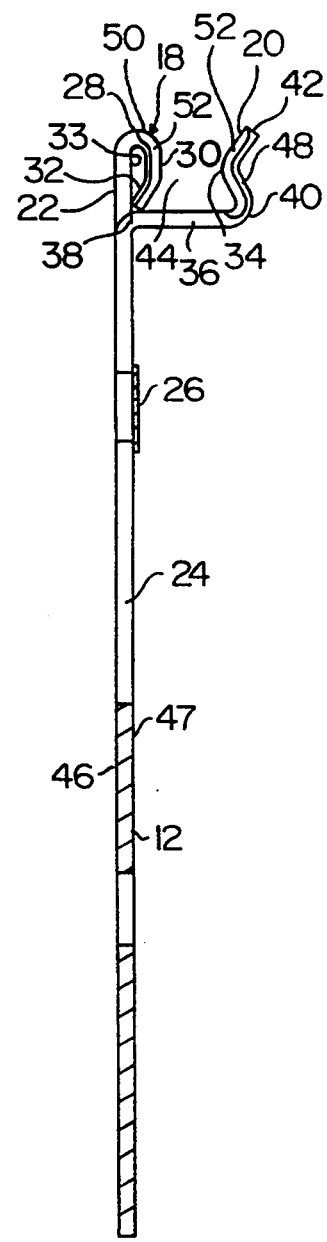
FIG. 2 is a sectional view taken along line 2—2 of FIG. 1.
Figure 4:
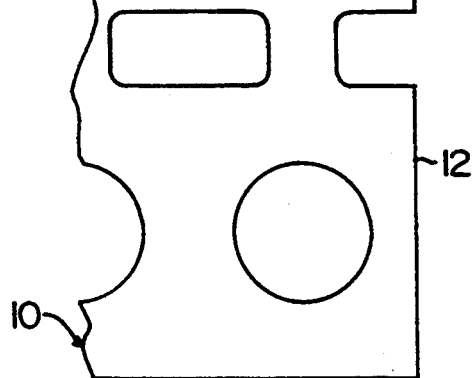
FIGS. 4 and 5 are sectional views taken, respectively, along lines 4—4 and 5—5 of FIG. 3.
Figure 5:
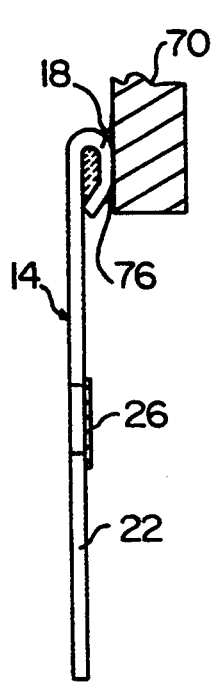

As illustrated in FIG. 1, terminals 14 and 16 are arranged along the length of the strip 10. Adhesive orienting tape 26 may be applied to the median portions of the tails 22 and 24 to maintain proper orientation between the solder terminals, particularly during attachment of the terminals to a substrate and after severing from carrier strip 12 as shown in FIGS. 4 and 5. Contact arms 18 are formed from portions of the ends of tails 22 bent back through an angle of approximately 180 degrees and are connected to the ends of the straight tails 22 by reverse bend portions 28 at the ends of tails 22. As illustrated in FIG. 2, each arm 18 includes a central base 30 which is spaced a distance away from the free end of tails 22 and is joined to bend portion 28. The free end 32 of arm 18 is bent back toward and engages the tail 22 below the reverse bend portion 28. The reverse bend portion and free end 32 support the contact base 30 a distance to one side of tails 22 to define a solder recess 33 between the base and tail.

Arm 20 includes a contact base 34 located opposite contact base 30 and joined to the free end of contact tail 24 by a lateral or a bridge member 36. Member 36 joins the free end of arm 22 at a 90-degree bend 38, extends a distance away from tail 24 and joins one end of arm 20 at a second approximate 90-degree bend 40. Bend 40 is located across from the free end 32 of base 30 and the free end 42 of base 20 is located across from the reverse bend portion 28. As illustrated in FIG. 2, contact bases 30 and 34 are located opposite each other to define the minimum spacing gap 44 between the alternating arms 18 and 20 spaced along the length of the terminal strip.

The terminal strip 10 is formed from thin two-sided metal strip stock material with the contact bases 30 and 34 of arms 18 and 20 being formed from side 46 of the strip as shown in FIGS. 1 and 2. Integral solder masses 48 and 50 are provided on the contact bases 30 and 34. These solder masses may be identical to the solder masses disclosed in U.S. Pat. No. 5,015,206, assigned to Die Tech, Inc. of York Haven, Pa. The disclosure of U.S. Pat. No. 5,015,206 is incorporated herein by reference. Each solder mass 48 and 50 includes a thin solder layer overlying and integrally bonded to the base and a pair of solder reservoirs 52 extending along the edges of the base and joined to the integral solder layer. As illustrated in FIGS. 1 and 2, the reservoirs 52 extend along the edges of both bases 30 and 34.

Figure 6:
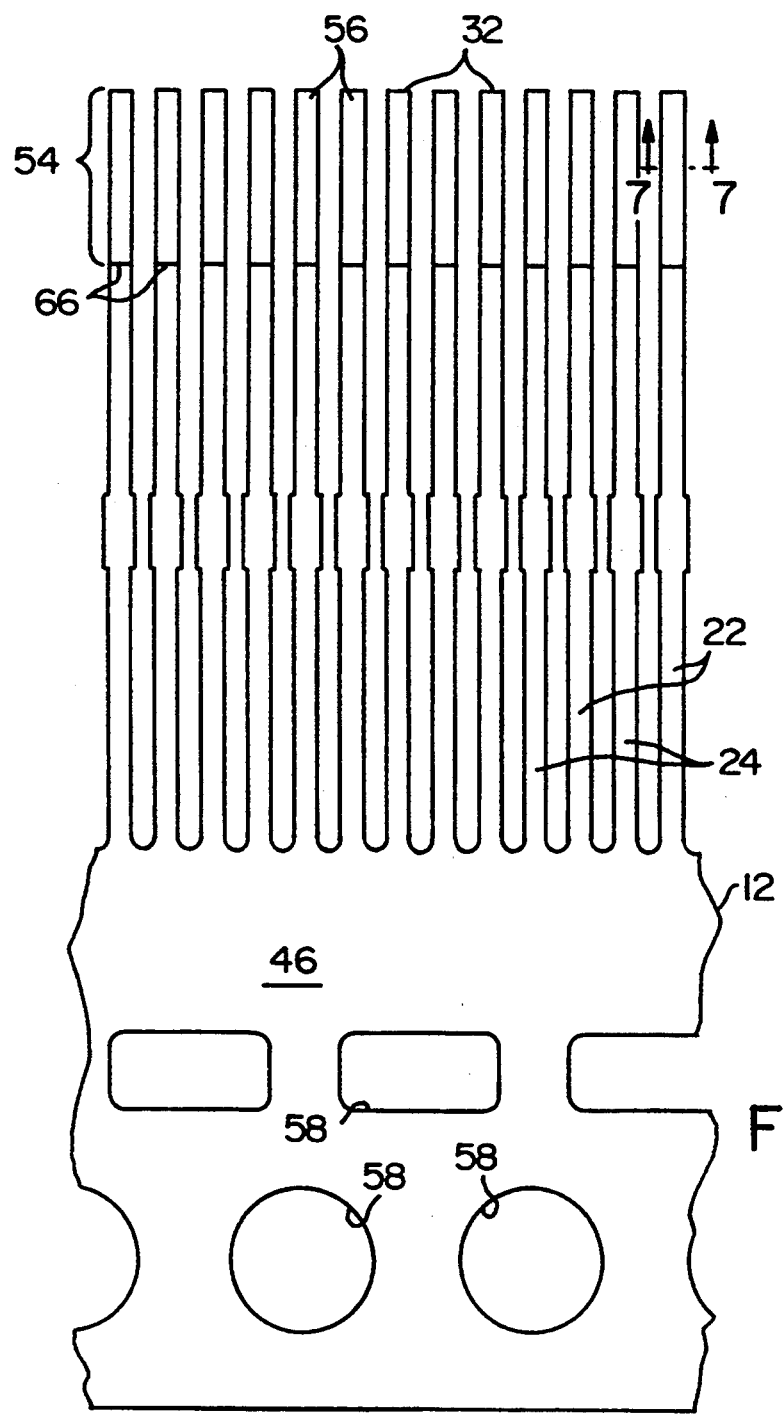
FIG. 6 is a top view of a stamped strip preform used in the manufacture of the solder terminal strip shown in FIG. 1.
Figure 7:
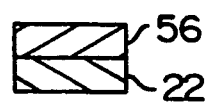
FIG. 7 is a sectional view taken along line 7—7 of FIG. 6.
Figure 8:
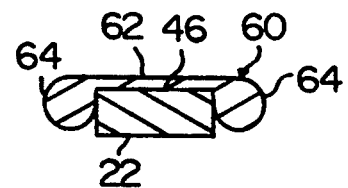
FIG. 8 is a sectional view like FIG. 7 shown after forming of the integrally-bonded solder layer on the solder terminal.

FIGS. 6, 7 and 8 further illustrate the manufacture of terminal strip 10. The terminal strip is formed from an elongate metal strip with a solder overlay layer 54 extending along one edge of the strip. The layer is metallurgically bonded to the strip. Carrier strip 12 is punch-formed from the edge of the strip away from the solder overlay layer. Long contact tails 22 and 24 are stamp-formed from the metal strip and extend laterally to one side of carrier strip 12 leaving a relatively thick solder layer 56 on the end portions of the tails. As illustrated in FIG. 7, relatively thick solder bodies 56 are integrally bonded to the free ends of the contact tails 22 and 24. These bodies 56 are all located on side 46 of the metal strip. The stamping operation also forms pilot and cut-off holes 58 in strip 10.

After stamp-forming of the preform shown in FIG. 6, the ends of the tails 22 and 24 are supported on an anvil and a flattening tool is lowered over the tops of the solder masses 56 to reduce the height of the masses and extrude the solder to either side of the tails 22 and 24 to form integral solder masses 60. Each solder mass includes a thin solder layer 62 overlaying and metallurgically bonded to a surface 46 of each tail 22, 24 and a pair of rounded integral solder reservoirs 64 extending along both edges of the tail a distance equal to the width of the original solder layer 54. The flattening operation extrudes the solder in masses 56 outwardly of the tails and below the surface of the thin solder layer 62 so that the reservoirs, when melted, provide a volume of molten solder sufficient to form reliable electrical connections between the bases and contact pads on a substrate.

After stamping the preform shown in FIG. 6 and flattening of the solder masses as illustrated in FIG. 8, the straight tails 22 and 24 are stamp-bent to form terminals 14 and 16 so that contact bases 30 and 34 and solder masses 48 and 50 originally located on strip side 46 are located on the other side 47 of the strip and base 30 faces away from side 47 and base 34 faces side 47.

During the stamping of the flat preform shown in FIGS. 6, 7 and 8, the outer ends of tails 22 with the integrally-bonded solder masses 60 on end 42 are first bent down at the free ends 32 thereof and are then bent 180 degrees at the reverse bend portions 28 at inner edge 66 of the solder layer 54 to form the reverse bend arms 18 shown in FIGS. 2 and 4 with the solder mass 50 on each arm 18 facing away from surface 47. At the same time, the ends of contact tails 24 are stamped to form solder contact arms 20 with attached solder masses 48, bridge members 36 and bends 38 and 40.

Stamp forming of the solder terminals 14 and 16 as described forms a carrier strip with contact arms 18 and 20 each having an integral outer mass 48, 50, like mass 60 shown in FIG. 8, with the contact arms facing each other to permit mounting of the terminal strip on a substrate to form soldered connections between the individual solder terminals and rows of closely-spaced contact pads located on opposing sides of an edge of the substrate. Forming of the solder masses as described requires first stamping of the long terminal tails or strips 22 and 24 from strip stock with narrow spacing between adjacent strips and with an integral solder layer adhered to one side of the stock. After stamping the solder mass is formed by reducing the thickness of the solder masses 56 and extruding the bulk of the solder in the masses over and along the adjacent edges of the strips. In this way, as described in U.S. Pat. No. 5,015,206, it is possible to position the solder contact arms 18 and 20 on closely adjacent pads of a substrate, and solder the contact arms to the pads by applying sufficient heat to melt the solder forming layers 62 and in the reservoirs 64. The molten solder is capillary-drawn into the interface between the contact arms and the substrate pad to form reliable soldered connections. Excess molten solder melted from arm 18 is drawn into solder recess 33.

It is desirable to manufacture substrate terminal strip 10 from metal stock having a flat solder overlay layer 54 applied to one side of the strip only. Flattening and extrusion of the solder is facilitated by the ability to support side 47 of the strip away from the solder overlay layer on a solid support or anvil and then move a flat tool down toward the anvil a distance sufficient to extrude the solder as shown in FIG. 8 leaving the required thin solder layer 62 bonded to and overlying the contact surfaces of each arm 18 and 20. Manufacturing a terminal strip with solder terminals having contact arms facing in opposite directions from a strip having a solder layer on one side of the strip only requires that one set of the contact arms be joined to contact tails by reverse bends, similar to portion 28, in order to reverse the orientation of the solder mass. The solder mass 48 on base 20 faces in the same direction as surface 46 but is offset from surface 46 a distance equal to the length of bridge member 36.

Figure 3:
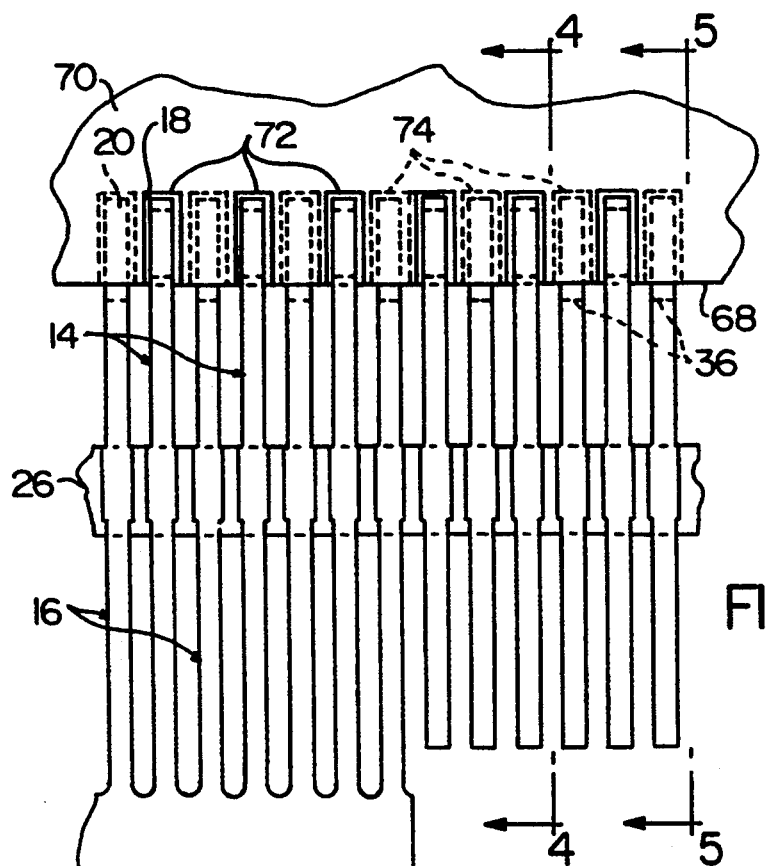
FIG. 3 is a view similar to FIG. 1 showing the strip attached to one edge of a circuit substrate.

FIGS. 3, 4 and 5 illustrate a portion of a solder terminal strip 10 mounted on an edge 68 of circuit substrate 70. A row of spaced metallized contact pads 72 extends along one side of the substrate at edge 68 and a row of spaced metallized contact pads 74 extends along the edge 68 on the other side of the substrate. As shown in FIG. 3, pads 72 and 74 are staggered with each pad 72 located between a pair of pads 74. The spacing between adjacent pads 72, 74 along edge 68, is equal to the spacing between adjacent solder terminals 14 and 16 in strip 10.

Solder terminal strip 10 is positioned adjacent to edge 68 of substrate 70 with each solder contact arm 18 located to one side of a pad 72 on one side of the substrate and each solder contact arm 20 located adjacent a contact pad 74 on the opposite side of the substrate. The strip and substrate are then moved together to position the contact arms over the respective pads as shown in FIG. 3. Adhesive strip 26 holds the tails together in plane of strip 10. The minimum spacing of gap 44 is slightly less than the width of the substrate 70 so that the solder terminals are spread apart a slight distance and contact bases are held in intimate contact against the pads. When strip 10 is fully inserted onto the substrate bridge 36 bottoms against edge 68 to maintain proper location of the arms 18 and 20 on the pads. See FIGS. 4 and 5.

Following insertion, the solder masses on the arms 18 and 20 are melted and flow by capillary action into the spaces between the contact pads and the arms to form reliable soldered connections 76 and 78 joining arms 18 and 20 to pads 72 and 74 respectively. Excess solder is drawn into recesses 33.

Following soldering, carrier strip 12 may be cut away as illustrated in FIG. 3 leaving terminal tails 14 and 16 soldered to the pads on the substrate 70 and extending outwardly from the substrate. Tape 26 maintains the small and relatively delicate tails in proper position with respect to each other during insertion and until the tails are connected to electrical contacts on a circuit member, connector or the like.

Substrate 70 may be a multi-layer ceramic substrate having a large number of very small circuit elements. These substrates are small in size and require a large number of contact pads at the edges of the substrate for forming electrical connections with other circuit elements. During the manufacture of the substrates, the ceramic material may shrink unevenly thereby shifting the location of the pads on the substrate from the desired or nominal position on a theoretically perfect substrate. As shown in FIG. 3, the spacing of adjacent pads 72 and 74 along edge 68 is very close indeed. In a typical substrate 70, the substrate pads on each side of the substrate may have a center-to-center spacing of approximately 0.032 inch. In order to form electrical connections with the pads on substrates of this type, it is necessary that the center-to-center spacing between the longitudinal axes of adjacent solder terminals 14 and 16 in the carrier strip be approximately 0.016 inches, a very small distance indeed.

The solder terminal strip 10 establishes reliable solder connections with pads 72 and 74 spaced apart as described. Terminal strip 10 may be formed from thin metal stock having a thickness of approximately 0.005 inch with tails 22 and 24 having a width of approximately 0.008 inch and with the solder reservoirs 52 extending laterally of the edges of the contact arms 18 and 20 a distance of approximately 0.004 inch on each side of the arm, or approximately ¼ the width of the arm. Integral solder masses 60 including the thin bonded overlying solder layers 62 and solder reservoirs 64 assure formation of reliable solder connections between these very small pads and solder terminals despite shifting of the pads due to uneven shrinking of the substrate.

FIGS. 9 through 12 illustrate a second preferred embodiment of the invention wherein a solder terminal strip 80, similar to strip 10, includes a carrier strip 82 and a plurality of solder terminals 84 and 86 extending laterally from one side of the carrier strip and alternating along the length of the carrier strip. Reverse bend solder contact arms 88 and 90 are provided on the ends of solder terminals 84 and 86 away from the strip 82. The solder terminals 84 and 86 include contact tails 92 and 94 with the contact tails extending between the strip 82 and reverse bend portions 96 and 98 at the ends of the tails away from the strip joining the tails to the arms 88 and 90. The contact arms 88 and 90 are similar to contact arms 18 of solder terminal strip 10 as previously described and include end portions 100, like free ends 32, which are bent inwardly back toward contact tails 92 and 94 and hold the arms 88 and 90 outwardly from the contact tails. A laterally extending or bridge member 102 is joined to end portion 100 at an outward bend and extends perpendicularly away from tail 94 to an upwardly extending contact arm 104, like arm 20. The arms 104 and 90 face each other and include adjacent contact bases 106 spaced apart by gap 108 slightly less than the thickness of a substrate on which strip 80 is mounted.

The solder terminal strip 10 is stamp-formed from sheet metal stock having a solder overlay layer, like layer 54 previously described, integrally bonded to side 110 of strip 80. The solder layer has an inner edge 112 located on the formed strip 80 adjacent the reverse bend portion 98 on the free end of tail 94. During stamp forming of strip 80, the extensions of tails 92 and 94 extending across the width of the solder overlay layer are reduced in thickness from a cross section as shown in FIG. 7 to a cross section shown in FIG. 8 to form integral solder masses 114 and 116 bonded to the strip material and extending along the lengths of the extensions of the tails to the portions 100 and ends of arms 104. As illustrated in FIG. 10, the formed extension of tail 92 beyond edge 112 is shorter than the formed extension of tail 94. The extension of tail 92 is trimmed during stamping.

The bonded solder overlie layers on the extensions of tails 92 and 94 are reduced in thickness as previously described to form the solder masses 112 and 114 extending along the lengths of the extensions of the tails with reservoirs extending along both side edges of the extensions of the tails.

Figure 11:
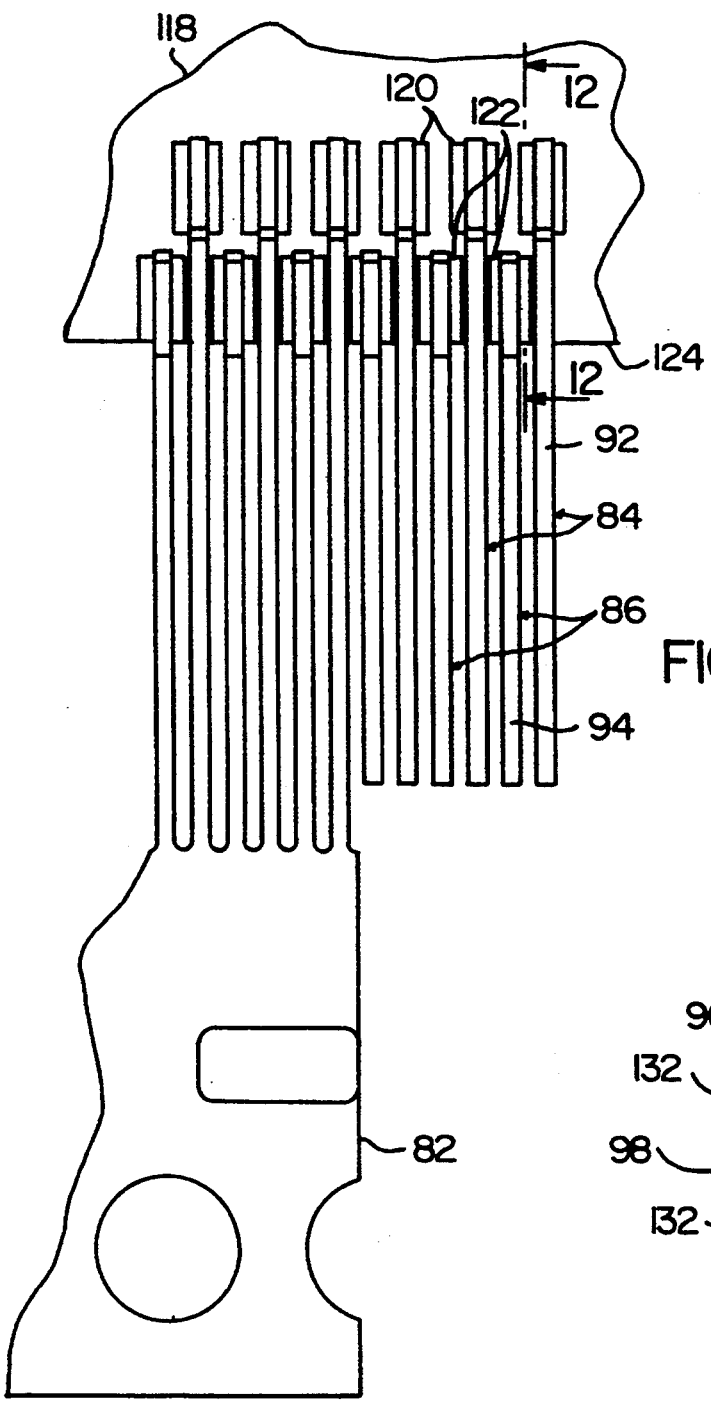
FIG. 11 is a top view showing the strip of FIG. 9 attached to a substrate.
Figure 12:
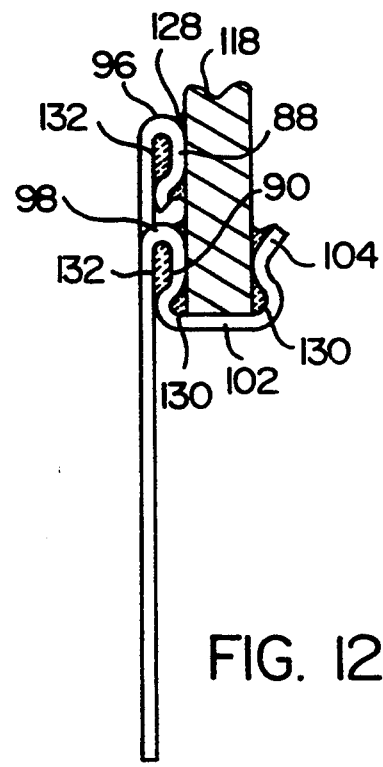
FIG. 12 is a sectional view taken along line 12—12 of FIG. 11.

Solder terminal strip 80 is attached to substrate 118 shown in FIG. 11 having a dual row of staggered contact pads 120 and 122 formed along edge 124. Pads 120 and 122 overlap in width as illustrated.

The solder strip is positioned to one side of edge 124 and then is moved toward the substrate to locate each contact arm 88 over one of the pads 120 and each contact arm 90 over one of the pads 122. The depth of insertion of the strip onto the substrate is limited by engagement between the bridge 102 and edge 124. The thickness of the substrate is slightly greater than the width of gap 108 so that arm 104 engages the side of the substrate away from the contacts 120 and 122 and holds the strip in place on the substrate with contact arms 88 and 90 engaging the contact pads. Arms 88 hold tails 92 above the surface of substrate 118 and above pads 122.

The terminal tails 92 and 94 of strip 80 are spaced more closely than the terminal tails of strip 10 so that the solder reservoirs 126 extending outwardly from the edges of the formed ends of the tails overlap each other and would contact each other except that the arms 88 and 90 are staggered along the length of the strip. Staggering of the contact arms permits providing formed integral solder masses on the ends of very closely spaced small solder terminals for forming dense electrical connections with staggered row substrate pads. The substrate 118 may be a multi-layer ceramic type which is susceptible to dimensional changes during curing of the ceramic. This means that the actual location of the pads 120 and 122 on the substrate may shift considerably from the theoretical location of the pads on a perfect substrate. The very small size of the solder terminals of strip 80 permit locating the contact arms 88 and 90 on the center of the pads 120 and 122, when ideally located on the substrate, with assurance that the arms will form electrical connections with the pads despite shifting of the pads due to dimensional tolerances inherent in manufacture of the substrate.

Terminals 84 and 86 are soldered to the pads 120 and 122 by heating and melting the solder so that the solder is drawn into the interfaces at the pads and forms reliable solder connections 128 and 130 joining arms 88 and 90 to the pads. If desired, a contact pad may be provided under each arm 104 located on the side of the substrate away from pads 122 and 124. Heating of the solder reservoirs on arms 104 would form reliable solder connections with such pads, if provided. If desired, these pads may replace pads 122.

The reverse bend contact arms 88 and 90 are spaced a distance to one side of the ends of tails 92 and 94 to define hollow solder recesses 132. During soldering molten solder formed from melting solder reservoirs 126 in addition to the solder required to form the solder connections 128 is drawn by capillary action into recesses 132. In this way, the excess solder is drawn into the recesses and is not free to flow on the surface of the substrate and possibly form undesired solder bridges between adjacent pads. Likewise, excess solder formed in the ends of terminals 84 is drawn into the recesses 132 located between the ends of tails 94 and arms 90.

After terminals 84 and 86 have been soldered to the pads on the substrate the carrier strip 82 is cut away to facilitate forming electrical connections between the ends of tails 92 and 94 and other circuit elements, as required.

While I have illustrated and described preferred embodiments of my invention, it is understood that these are capable of modification, and I therefore do not wish to be limited to the precise details set forth, but desire to avail myself of such changes and alterations as fall within the purview of the following claims.

What I claim as my invention is:

1. A solder terminal strip comprising:
   A) an elongate carrier strip;
   B) a set of first solder terminals spaced at intervals along the carrier strip, first connections integrally joining the first solder terminals to the carrier strip, each first solder terminal including,
      i) a first contact tail extending away from the carrier strip to an end remote from the carrier strip,
      ii) a first arm integrally joined to the first contact tail at a distance away from the carrier strip, and
      iii) a first contact base on the first arm;
   C) a set of second solder terminals spaced at intervals along the carrier strip between the set of first solder terminals, second connections integrally joining such solder terminals to the carrier strip, each second solder terminal including,
      i) a second contact tail extending away from the carrier strip to an end remote from the carrier strip,
      ii) a second arm located a distance away from the carrier strip and to one side of the second contact tail,
      iii) a second contact base on the second arm facing away from the second contact tail and,
      iv) a reverse bend portion integrally joining said second contact tail and second arm so that the arm overlies a portion of the contact tail and the second contact base faces away from such tail; and
   D) an integral solder mass comprising a thin solder layer integrally bonded to the second contact base, a solder reservoir extending along an edge of the contact base and joined to the thin solder layer and a solder recess located on a side of the second arm facing the second contact tail.

2. A solder terminal strip as in claim 1 wherein the reverse bend portions are located at the ends of the contact tails and the arms are located to one side of the ends of the contact tails.

3. A solder terminal strip as in claim 1 wherein said second arms are spaced a distance to one side of the second contact tails and said solder recesses cut located between each such arm and solder tail.

4. A solder terminal strip as in claim 1 wherein the first and second arms are located in spaced rows located at different distances from the carrier strip for forming electrical connections with spaced rows of staggered metallized contact pads.

5. A solder terminal strip as in claim 1 wherein the width of the solder masses is greater than the spacing between adjacent solder terminals.

6. A solder terminal strip as in claim 1 wherein said first and second contact bases face in opposite directions and define a gap extending along the length of the carrier strip for receiving the edge of a substrate.

7. A solder terminal strip as in claim 6 including a second integral solder mass attached to the contact base of each said first arm.

8. A solder terminal strip comprising:
A) an elongate carrier strip;
B) a set of first solder terminals spaced at intervals along the carrier strip, first connections integrally joining the first solder terminals to the carrier strip, each first solder terminal including,
   i) a first contact tail extending away from the carrier strip to an end remote from the carrier strip,
   ii) a first arm integrally joined to the first contact tail at a distance away from the carrier strip, and
   iii) a first contact base on the first arm;
C) a set of second solder terminals spaced at intervals along the carrier strip between the set of first solder terminals, second connections integrally joining such solder terminals to the carrier strip, each second solder terminal including,
   i) a second contact tail extending away from the carrier strip to an end remote from the carrier strip,
   ii) a second arm located a distance away from the carrier strip and spaced a distance to one side of the second contact tail to define a solder recess located between such arm and tail, said second arm including an end portion engaging said second contact tail,
   iii) a second contact base on the second arm facing away from the second contact tail and,
   iv) a reverse bend portion integrally joining said second contact tail and second arm so that the arm overlies a portion of such contact tail and the second contact base faces away from such tail; and
D) an integral solder mass comprising a thin solder layer integrally bonded to the second contact base and a solder reservoir extending along an edge of the contact base and joined to the thin solder layer.

9. A solder terminal strip comprising:
A) an elongate carrier strip;
B) a set of first solder terminals spaced at intervals along the carrier strip, first connections integrally joining the first solder terminals to the carrier strip, each first solder terminal including,
   i) a first contact tail extending away from the carrier strip to an end remote from the carrier strip,
   ii) a first arm integrally joined to the first contact tail at a distance away from the carrier strip, and
   iii) a first contact base on the first arm;
C) a set of second solder terminals spaced at intervals along the carrier strip between the set of first solder terminals, second connections integrally joining such solder terminals to the carrier strip, each second solder terminal including,
   i) a second contact tail extending away from the carrier strip to an end remote from the carrier strip,
   ii) a second arm located a distance away from the carrier strip and to one side of the second contact tail,
   iii) a second contact base on the second arm facing away from the second contact tail and,
   iv) a reverse bend portion integrally joining said second contact tail and second arm so that the arm overlies a portion of such contact tail and the second contact base faces away from such tail,
   v) the contact bases of said first and second solder terminals facing in the same direction, and
D) an integral solder mass comprising a thin solder layer integrally bonded to the second contact base and a solder reservoir extending along an edge of the contact base and joined to the thin solder layer.

10. A solder terminal strip as in claim 9 including solder recesses between each arm and adjacent tail.

11. A solder terminal strip comprising:
A) an elongate carrier strip;
B) a set of first solder terminals spaced at intervals along the carrier strip, first connections integrally joining the first solder terminals to the carrier strip, each first solder terminal including,
   i) a first contact tail extending away from the carrier strip to an end remote from the carrier strip,
   ii) a first arm integrally joined to the first contact tail at a distance away from the carrier strip, and
   iii) a first contact base on the first arm;
C) a set of second solder terminals spaced at intervals along the carrier strip between the set of first solder terminals, second connections integrally joining such solder terminals to the carrier strip, each second solder terminal including,
   i) a second contact tail extending away from the carrier strip to an end remote from the carrier strip,
   ii) a second arm located a distance away from the carrier strip and to one side of the second contact tail,
   iii) a second contact base on the second arm facing away from the second contact tail and,
   iv) a reverse bend portion integrally joining said second contact tail and second arm so that the arm overlies a portion of such contact tail and the second contact base faces away from such tail;
D) either said first or said second solder terminals including a third arm, a bridge and a third contact base on such arm; and
E) an integral solder mass comprising a thin solder layer integrally bonded to the second contact base and a solder reservoir extending along an edge of the contact base and joined to the thin solder layer.

12. A solder terminal comprising,
A) a one-piece metal body stamp-formed from flat uniform thickness strip stock, the body including
   i) an elongate contact tail having opposed sides,
   ii) a first arm spaced to one side of the contact tail, a contact base on the first arm facing away from the tail,
   iii) a solder recess located between the first arm and the contact tail,
   iv) a U-shaped reverse bend body portion integrally joining the arm to the tail, such portion located to one side of the arm; and
B) an integral solder mass attached to the arm, the solder mass including a thin solder layer integrally bonded to the contact base and a solder reservoir joined to the thin solder layer.

13. A solder terminal as in claim 12 wherein the arm includes an end engaging the adjacent side of the contact tail.

14. A solder terminal as in claim 12 wherein said reverse bend body portion is located at an end of the contact tail and the first arm overlies and is spaced outwardly from the end of the contact tail.

15. A solder terminal as in claim 12 wherein said integral solder mass includes a second solder reservoir extending along a second edge of the first contact base below the level of the thin solder layer and joined to the thin solder layer only.

16. A solder terminal as in claim 12 including a second arm joined to the contact tail and including a second contact base spaced from and facing the first contact base.

17. A solder terminal as in claim 16 including a second integral solder mass like said first integral solder mass integrally bonded to said second contact base.

18. A solder terminal as in claim 16 including a bridge member joining said second arm to said contact tail.

19. A solder terminal as in claim 18 wherein said bridge member joins said first arm away from said reverse bend portion.

20. A solder terminal strip comprising:
a) an elongate carrier strip;
b) a plurality of first solder terminals spaced at intervals along the carrier strip, first connections integrally joining each said first solder terminal to the carrier strip, each first solder terminal including:
 i) an elongate first contact tail extending away from the carrier strip;
 ii) a first contact arm located a distance away from the carrier strip and to one side of the first contact tail, a solder recess located between the first arm and the tail, the first arm including a first contact base facing away from the first contact tail, and a reverse bend portion integrally joining the first contact arm to the tail;
 iii) a second contact arm located to the same side of the tail as the first contact arm and spaced from the first contact arm, the second contact arm including a second contact base facing the first contact base and the contact tail;
 iv) a bridge member joining the first contact arm and the second contact arm, the bridge member, first contact arm and second contact arm defining a gap for receiving the edge of a substrate, the substrate having a thickness; and
 v) a first integral solder mass comprising a thin solder layer integrally bonded to the bridge member, first contact arm and second contact arm.

21. A solder terminal strip as in claim 20 wherein the reverse bend portion is U-shaped.

22. A solder terminal strip as in claim 20 wherein the first contact arm includes an end portion which engages one side of the first contact tail.

23. A solder terminal strip as in claim 20 wherein the contact bases are spaced apart slightly less than the thickness of the substrate.

24. A solder terminal strip as in claim 20 wherein the bridge member is essentially perpendicular the first contact tail.

25. A solder terminal strip as in claim 20 including a plurality of second solder terminals spaced at intervals along the carrier strip between the set of first solder terminals, second connections integrally joining second solder terminals to the carrier strip, each second solder terminal including:
a) a second contact tail extending away from the carrier strip;
b) a third contact arm located away from the carrier strip and to one side of the second contact tail, the third arm having a third contact base and a reverse bend portion integrally joining the third contact arm to the second contact tail so that the third contact arm overlies a portion of the second contact tail; and
c) a second integral solder mass comprising a thin solder layer integrally bonded to the third contact arm.

26. A solder terminal strip as in claim 25 wherein the reverse bend portion is U-shaped.

27. A solder terminal strip as in claim 25 wherein the second and third contact arms are staggered along the length of the carrier strip.

28. A solder terminal strip as in claim 25 wherein the third contact arm has an end portion which engages one side of the second contact tail.

29. A solder terminal strip as in claim 25 wherein the first and third contact bases face the same direction.

30. A solder terminal strip as in claim 29 including solder recesses between each arm and adjacent solder tail.

31. A solder terminal strip as in claim 25 wherein the width of the first and second solder masses is greater than the spacing between adjacent solder terminals.

32. A solder terminal strip as in claim 25 wherein the first contact arm is adjacent the third contact arm.

33. A solder terminal strip as in claim 20 wherein the solder mass is integrally bonded to the third contact base, reverse bend portion and second contact tail.

34. A solder terminal strip as in claim 33 wherein the solder mass is bonded to a side of the second contact tail away from the third contact arm.

* * * * *